(12) United States Patent
Ishihara et al.

(10) Patent No.: US 10,840,262 B2
(45) Date of Patent: Nov. 17, 2020

(54) MEMORY DEVICE AND MANUFACTURING METHODS THEREOF

(71) Applicant: TOSHIBA MEMORY CORPORATION, Tokyo (JP)

(72) Inventors: Hanae Ishihara, Yokkaichi Mie (JP); Shingo Nakajima, Yokkaichi Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/786,289

(22) Filed: Feb. 10, 2020

(65) Prior Publication Data

US 2020/0176474 A1 Jun. 4, 2020

Related U.S. Application Data

(62) Division of application No. 16/110,903, filed on Aug. 23, 2018, now abandoned.

(30) Foreign Application Priority Data

Mar. 13, 2018 (JP) ................. 2018-045803

(51) Int. Cl.
| | | |
|---|---|---|
| H01L 27/11582 | (2017.01) | |
| H01L 21/768 | (2006.01) | |
| H01L 27/1157 | (2017.01) | |
| H01L 21/02 | (2006.01) | |
| H01L 21/28 | (2006.01) | |
| H01L 21/311 | (2006.01) | |

(52) U.S. Cl.
CPC .. *H01L 27/11582* (2013.01); *H01L 21/76805* (2013.01); *H01L 21/76877* (2013.01); *H01L 27/1157* (2013.01); *H01L 21/02164* (2013.01); *H01L 21/02238* (2013.01); *H01L 21/02255* (2013.01); *H01L 21/28211* (2013.01); *H01L 21/31111* (2013.01); *H01L 21/76831* (2013.01)

(58) Field of Classification Search
CPC ........ H01L 21/76805; H01L 21/02164; H01L 21/28211; H01L 21/02255; H01L 27/11582; H01L 27/1157; H01L 21/76877; H01L 21/31111; H01L 21/76831

See application file for complete search history.

(56) References Cited

U.S. PATENT DOCUMENTS

2019/0096904 A1* 3/2019 Noguchi ........... H01L 27/11575

FOREIGN PATENT DOCUMENTS

JP 2006-277143 A 10/2006

\* cited by examiner

*Primary Examiner* — Thanh Y. Tran
(74) *Attorney, Agent, or Firm* — Kim & Stewart LLP

(57) ABSTRACT

The memory device includes a conductive layer, a plurality of first electrode layers stacked over the conductive layer and spaced from each other in a first direction, a semiconductor layer extending through the first electrode layers in the first direction, a second electrode layer provided between the conductive layer and the first electrode layers, and a semiconductor base, located between the conductive layer and the semiconductor layer and extending through the second electrode layer, wherein the semiconductor base has a first width at a portion thereof extending through the second electrode layer in the first direction and second width at a portion thereof connected to the semiconductor layer, and the first width is greater than the second width.

6 Claims, 13 Drawing Sheets

FIG. 12
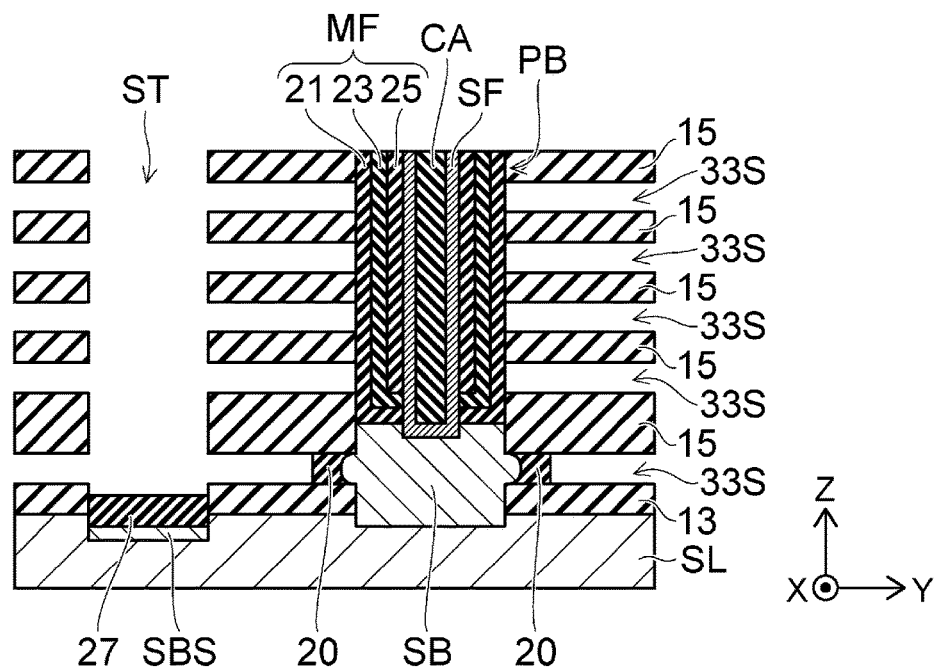
FIG. 12A
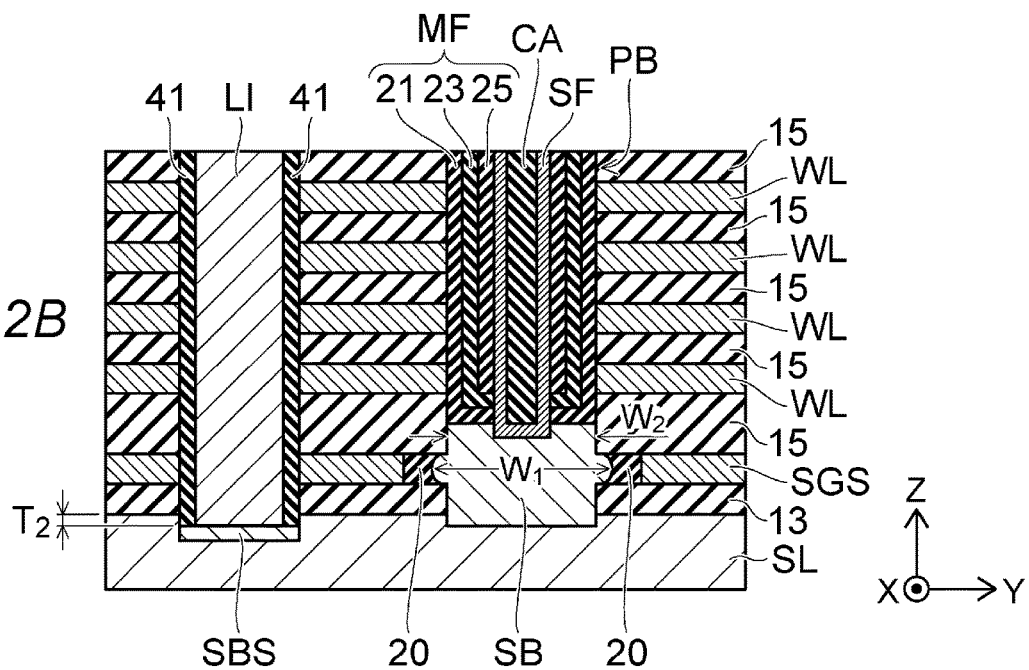
FIG. 12B

MEMORY DEVICE AND MANUFACTURING METHODS THEREOF

CROSS-REFERENCE TO RELATED APPLICATIONS

This application is a divisional of U.S. patent application Ser. No. 16/110,903, filed on Aug. 23, 2018, which application is based upon and claims the benefit of priority from Japanese Patent Application No. 2018-045803, filed on Mar. 13, 2018, the entire contents of which are incorporated herein by reference.

FIELD

Embodiments of the present disclosure relate to a memory device and methods for manufacturing thereof.

BACKGROUND

A memory device with memory cells arranged three-dimensionally have been developed. For example, NAND flash memory devices include a plurality of word lines stacked on a source layer and columnar semiconductor members that penetrate the plurality of word lines in the stacking direction thereof, and memory cells are provided at portions where the semiconductor members and the word lines intersect with each other. In memory devices having such a structure, the memory capacity can be increased by increasing the density of the semiconductor members per unit area of a substrate. However, when the size (e.g., diameter) of the semiconductor members are reduced in order to increase the density of the semiconductor members, their mechanical strength decreases. For this reason, the semiconductor pillars may be damaged in the manufacturing process of the memory device, thereby lowering the manufacturing yield of good devices.

DESCRIPTION OF THE DRAWINGS

FIGS. 12A and 12B show schematic cross-sectional views showing the manufacturing process continued from FIGS. 11A and 11B.

DETAILED DESCRIPTION

Figure 1:
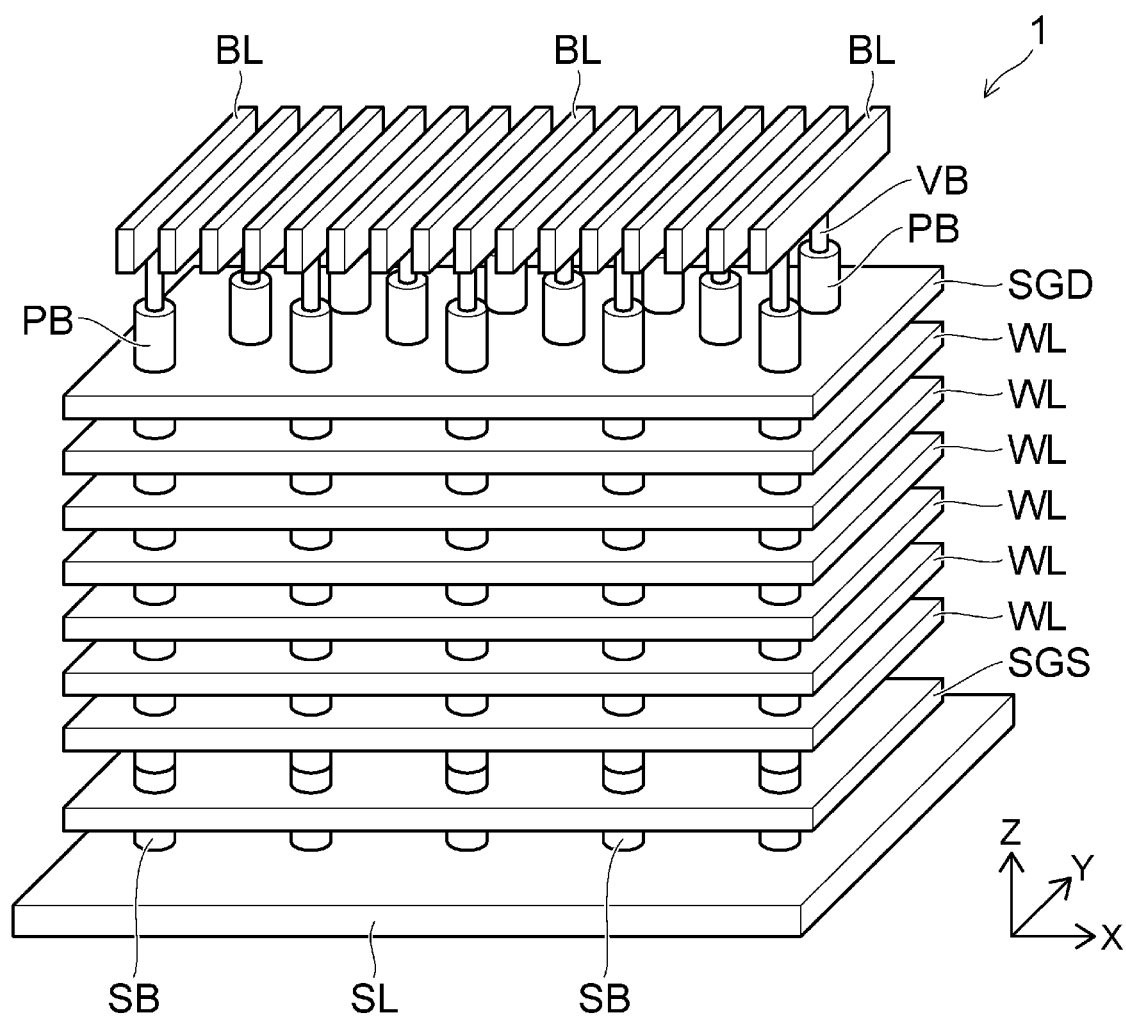
FIG. 1 is a perspective view schematically showing a memory device according to a first embodiment.

The embodiments herein provide a memory device with a semiconductor member having improved mechanical strength, and a method of manufacturing the same.

A memory device according to an embodiment includes a conductive layer, a plurality of first electrode layers stacked over the conductive layer and spaced from each other in a first direction, a semiconductor layer extending through the first electrode layers in the first direction, a second electrode layer provided between the conductive layer and the first electrode layers, and a semiconductor base, located between the conductive layer and the semiconductor layer and extending through the second electrode layer, wherein the semiconductor base has a first width at a portion thereof extending through the second electrode layer in the first direction and second width at a portion thereof connected to the semiconductor layer, and the first width is greater than the second width.

Hereinafter, embodiments will be described with reference to the drawings. The same portions in the drawings as denoted by the same reference numerals and detailed descriptions thereof are omitted as appropriate, and portions that are different will be described. Note that the drawings are schematic or conceptual, and the relationship between the thickness and the width of each portion, the ratio of sizes between portions, and the like are not necessarily the same as the actual ones. Further, even when the same portions are shown, the dimensions and proportions may be shown differently depending on the drawings.

Further, the arrangement and configuration of each portion will be described using the X-axis, the Y-axis, and the Z-axis shown in each drawing. The X-axis, the Y-axis, and the Z-axis are mutually orthogonal and represent the X direction, the Y direction, and the Z direction, respectively. Further, some descriptions will be made with the +Z direction being upward and the opposite direction being downward.

First Embodiment

FIG. 1 is a perspective view schematically showing a memory device 1 according to a first embodiment. The memory device 1 is, for example, a NAND flash memory device, and includes memory cells arranged three-dimensionally. In FIG. 1, an insulating film is omitted to show the configuration of the memory device 1.

The memory device 1 includes a conductive layer (hereinafter referred to as a source layer SL), a plurality of first electrode layers (hereinafter referred to as word lines WL or a select gate SGD), a plurality of columnar bodies PB, a second electrode layer (hereinafter referred to as a select gate SGS), and a semiconductor base SB.

The source layer SL is, for example, a P-type well provided in a silicon substrate. The source layer SL may be a conductive polysilicon layer provided on a silicon substrate with an interlayer insulating film (not shown) interposed therebetween.

The select gate SGS, the word lines WL, and the select gate SGD are stacked above the source layer SL with interlayer insulating films therebetween (not shown). The columnar bodies PB extend in the stacking direction (i.e., the Z direction) through each of the word lines WL and the select gate SGD. The semiconductor base SB penetrates the select gate SGS and is located between the columnar body PB and the source layer SL.

A plurality of bit lines BL are provided above the select gate SGD. The bit lines BL are electrically connected to a semiconductor layer SF (see FIG. 2) provided inside the columnar body PB through a connection plug VB.

Figure 2:
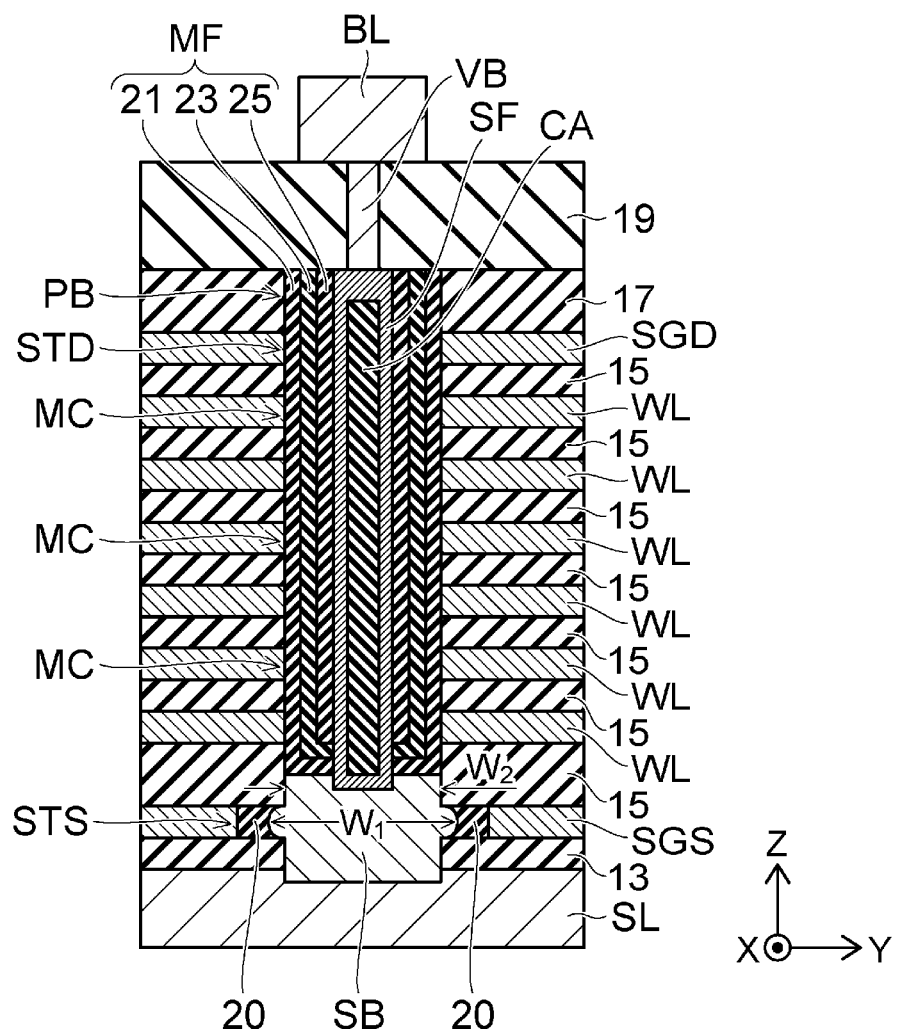
FIG. 2 shows a schematic cross-sectional view showing the memory device according to the first embodiment.

FIG. 2 shows a schematic cross-sectional view showing the memory device 1 according to the first embodiment. FIG. 2 is a schematic diagram showing a cross section of the columnar body PB and the semiconductor base SB.

The columnar body PB includes a memory film MF, a semiconductor layer SF, and an insulating core CA. The memory film MF includes, for example, a block insulating film 21, a charge retaining film 23, and a tunnel insulating film 25. The semiconductor layer SF is formed to cover the insulating core CA extending in the Z direction. That is, the semiconductor layer SF is provided in a columnar shape that includes the insulating core CA therein.

As shown in FIG. 2, the columnar body PB extends in the Z direction through the word lines WL, interlayer insulating films 15, the select gate SGD, and an insulating film 17. The interlayer insulating films 15 are provided between the word lines WL and between the word lines WL and the select gate SGD. The insulating film 17 is provided on top of the select gate SGD.

The bit lines BL are provided on top of the insulating film 19, and here is electrically connected to the semiconductor layer SF via the connection plug VB. The insulating film 19 is provided on top of the insulating film 17 and covers the upper end of the columnar body PB. The connection plug VB is provided so as to extend in the Z direction through the insulating film 19.

Memory cells MC are provided at portions where the columnar body PB and the word lines WL intersect with each other. A portion of the memory film MF is located between the semiconductor layer SF and the word lines WL and functions as a charge retaining portion of the memory cell MC. Further, a select transistor STD is provided at a portion where the columnar body PB and the select gate SGD intersect with each other.

The semiconductor base SB is connected to the source layer SL through the select gate SGS and the interlayer insulating film 13. The semiconductor base SB is connected to the semiconductor layer SF at its upper end. That is, the semiconductor layer SF is connected to the source layer SL via the semiconductor base SB. A selection transistor STS is provided at a portion where the semiconductor base SB and the select gate SGS intersect with each other.

An insulating film 20 is provided between the semiconductor base SB and the select gate SGS. The insulating film 20 functions as a gate insulating film of the select transistor STS. The insulating film 20 is formed by, for example, thermally oxidizing the semiconductor base SB and contains a same element as the semiconductor base SB.

The semiconductor base SB, in a direction between, and between the select gates SGS on either side thereof has a width W1 in the Y direction, and a width W2 in the Y direction in an upper portion thereof contacting the semiconductor layer SF. The width W1 of the portion intersecting the semiconductor base SB is substantially the same as or wider than the width W2 of the upper end of the semiconductor base SB.

Next, a method of manufacturing the memory device 1 according to the first embodiment will be described with reference to FIGS. 3 to 9. FIGS. 3A to 9B are schematic cross-sectional views showing a manufacturing process of the memory device 1.

Figure 3A:
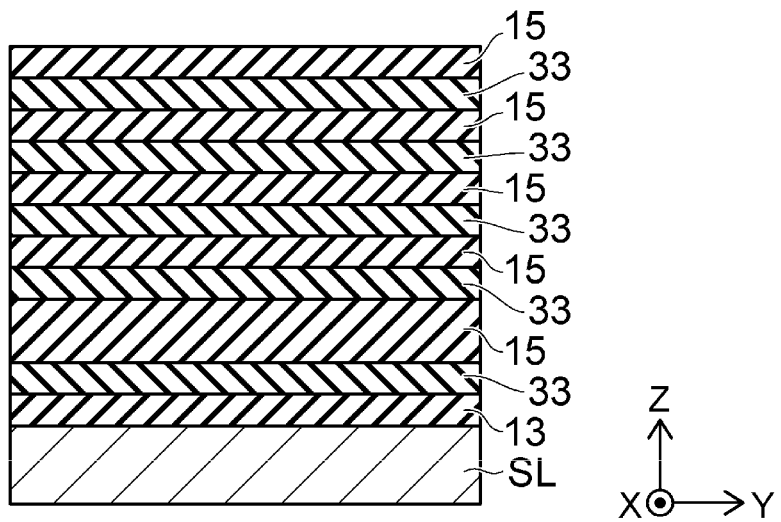
FIGS. 3A and 3B show schematic cross-sectional views showing a manufacturing process of the memory device according to the first embodiment.

As shown in FIG. 3A, interlayer insulating films 13, 15 and sacrificial films 33 are stacked on top of the source layer SL. The sacrificial films 33 and the interlayer insulating film 15 are alternately stacked. The interlayer insulating films 13, 15 are, for example, silicon oxide films. The sacrificial films 33 are, for example, silicon nitride films.

Figure 3B:
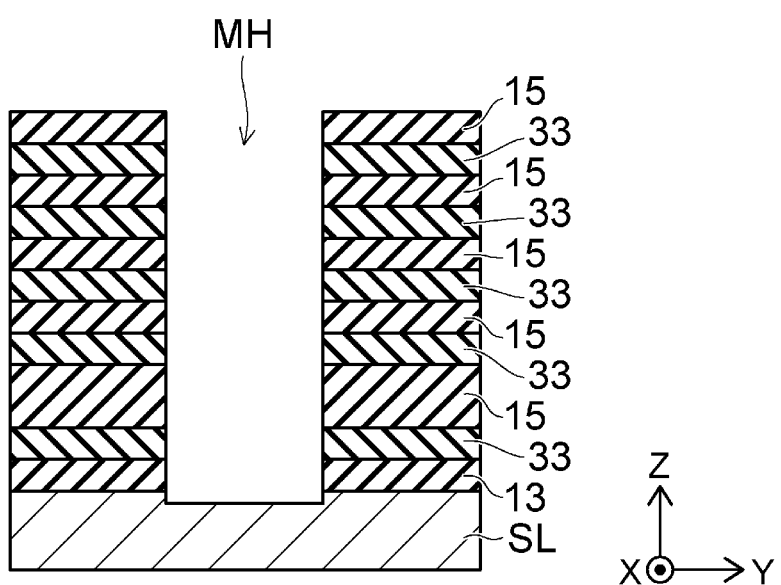

As shown in FIG. 3B, a memory hole MH having a depth extending from the uppermost interlayer insulating film 15 to the source layer SL is formed. The source layer SL is exposed at the bottom surface of the memory hole MH.

Figure 4A:
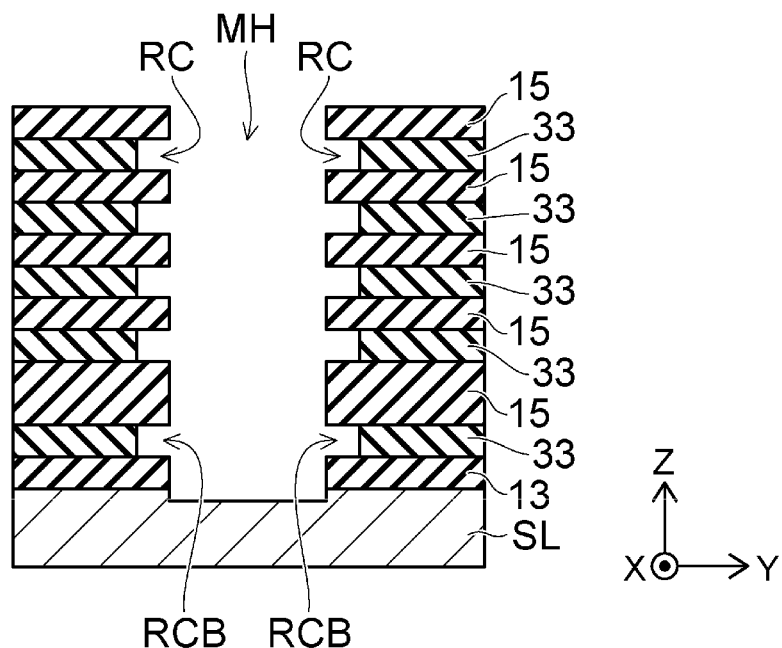
FIGS. 4A and 4B show schematic cross-sectional views showing the manufacturing process continued from FIGS. 3A and 3B.

As shown in FIG. 4A, a portion of each sacrificial film 33 exposed at the inner wall of the memory hole MH is selectively removed to form a plurality of recessed portions RC. For example, by supplying an etchant such as phosphoric acid into the memory hole, the sacrificial films 33 can be selectively removed without etching the interlayer insulating films 13, 15.

Figure 4B:
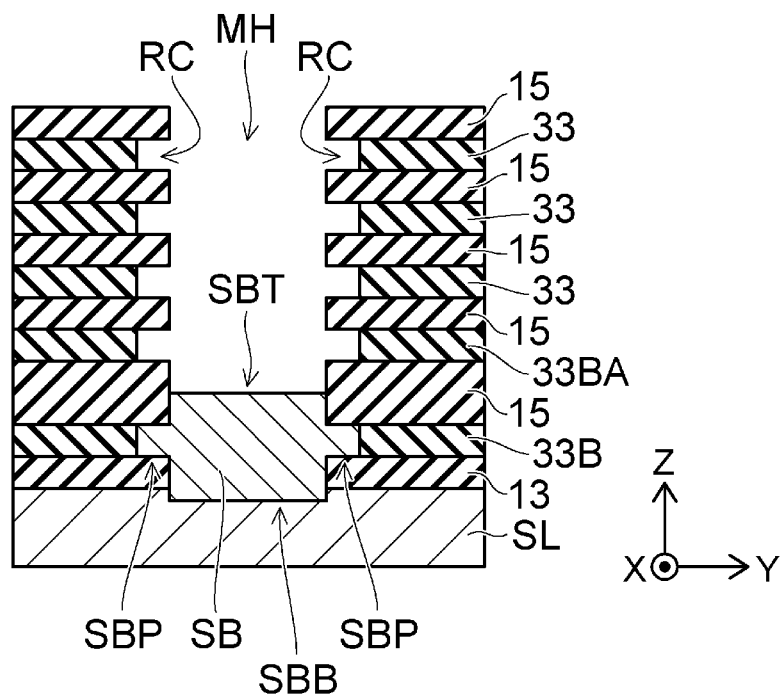

As shown in FIG. 4B, the semiconductor base SB is formed at the bottom of the memory hole MH. The semiconductor base SB is, for example, a P-type or undoped silicon layer, and is epitaxially grown on the source layer SL. Here, "undoped" means that impurity doping is not intentionally performed.

The bottom surface SBB of the semiconductor base SB is in contact with the source layer SL. The upper surface SBT of the semiconductor base SB is positioned between the sacrificial film 33B located closest to the source layer SL and the sacrificial film 33BA located closest to the sacrificial film 33B. Further, the semiconductor base SB is formed so as to fill the recessed portion RCB closest to the source layer SL. That is, the semiconductor base SB is formed to have a convex or extending portion SBP protruding in a lateral direction (i.e., both X and Y direction and thus circumferentially).

Figure 5A:
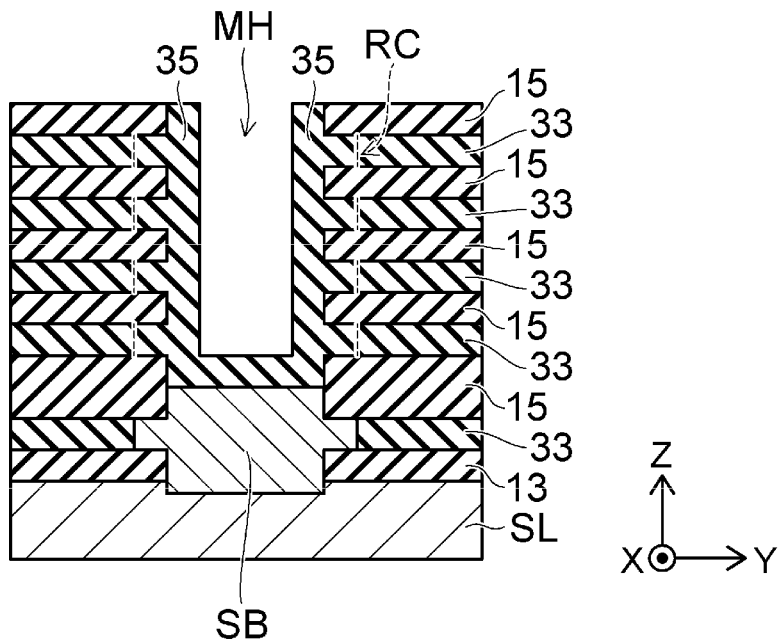
FIGS. 5A and 5B show schematic cross-sectional views showing the manufacturing process continued from FIGS. 4A and 4B.

As shown in FIG. 5A, an insulating film 35 is formed to cover the inner surface of the memory hole MH. As the insulating film 35, a material is used that can be selectively removed, with respect to the interlayer insulating films 13, 15, simultaneously with the sacrificial film 33. The insulating film 35 is, for example, a silicon nitride film. The insulating film 35 is formed so as to fill the recessed portions RC other than the recessed portion RC at the position closest to the source layer SL.

Figure 5B:
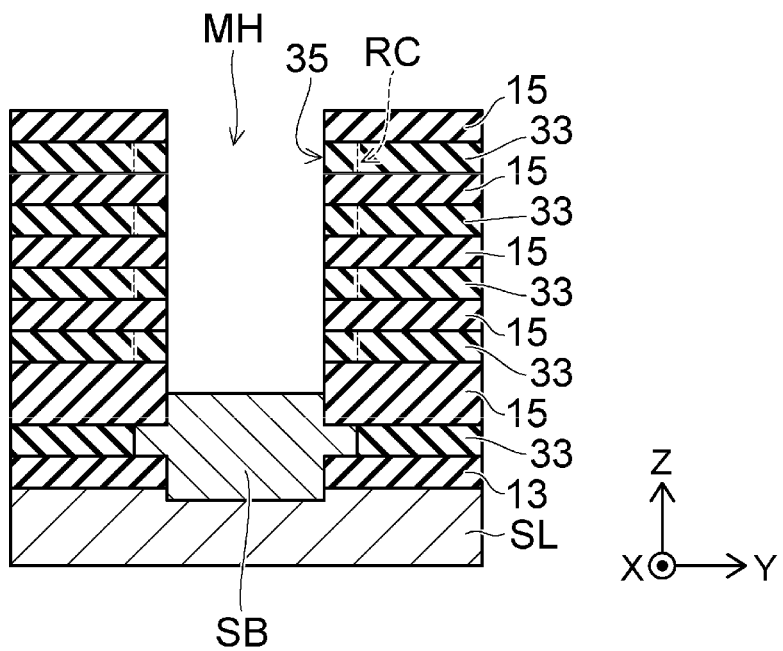

As shown in FIG. 5B, the insulating film 35 covering the inner surface of the memory hole MH is removed by, for example, isotropic dry etching. The portions of the insulating film 35 where recessed portions RC are filled thereby are not removed causing the inside wall of the memory hole MH to become a substantially flat surface.

Figure 6A:
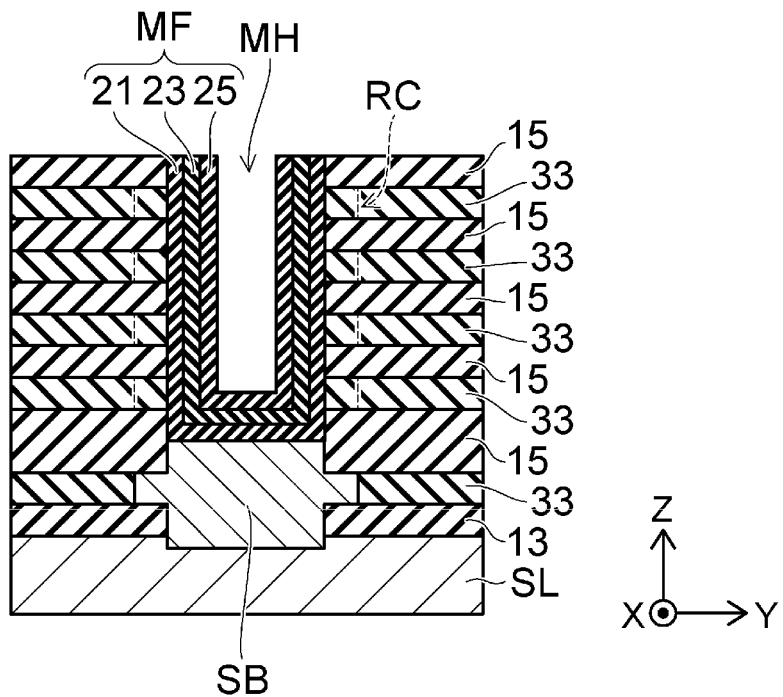
FIGS. 6A and 6B show schematic cross-sectional views showing the manufacturing process continued from FIGS. 5A and 5B.

As shown in FIG. 6A, the memory film MF is formed to cover the inner surface of the memory hole MH. The memory film MF is formed by sequentially depositing the block insulating film 21, the charge retaining film 23, and the tunneling insulating film 25 using, for example, chemical vapor deposition (CVD). The block insulating film 21 and the tunnel insulating film 25 are, for example, silicon oxide films. The charge retaining film 23 is, for example, a silicon nitride film.

Figure 6B:
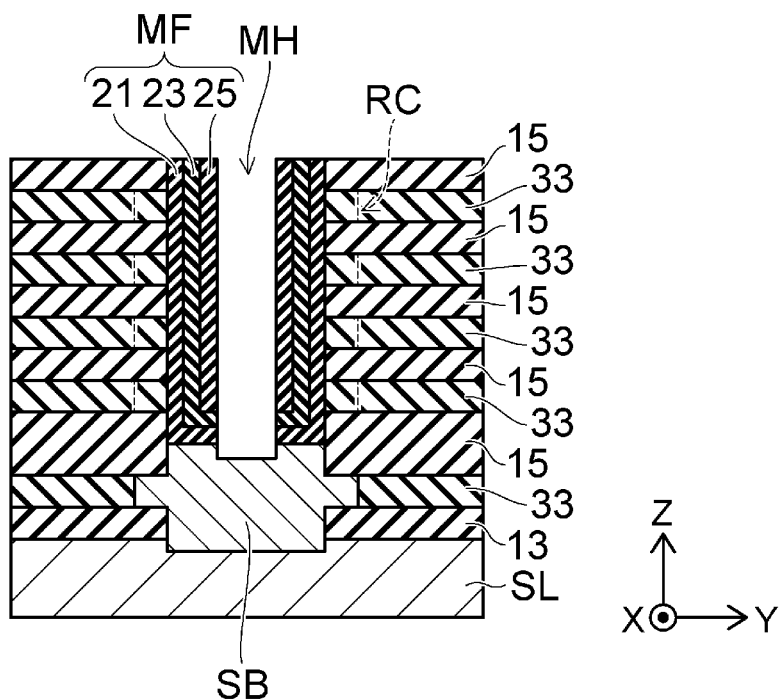

As shown in FIG. 6B, the portion of the memory film MF formed on the semiconductor base SB is selectively removed from the bottom surface of the memory hole MH. The memory film MF is selectively removed by, for example, anisotropic reactive ion etching (RIE). In this way, the semiconductor base SB can be exposed at the bottom surface of the memory hole MH.

Figure 7A:
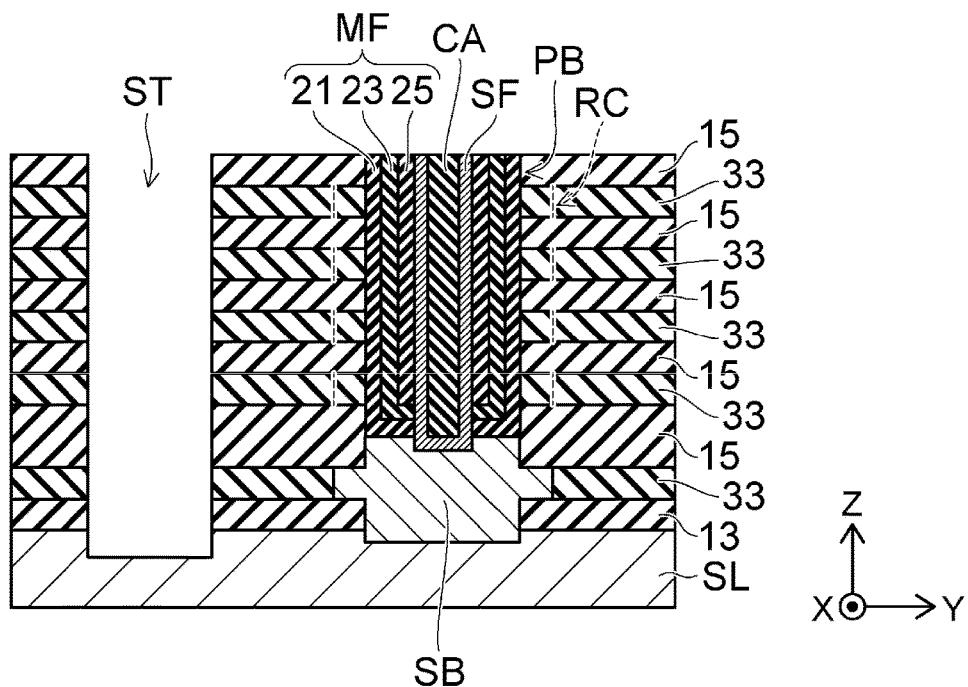
FIGS. 7A and 7B show schematic cross-sectional views showing the manufacturing process continued from FIGS. 6A and 6B.

As shown in FIG. 7A, the semiconductor layer SF and the insulating core CA are formed inside the memory hole MH. The semiconductor layer SF is, for example, a polysilicon layer formed by CVD. The semiconductor layer SF covers the memory film MF. The semiconductor layer SF is in contact with the tunnel insulating film 25 and the semiconductor base SB at the bottom surface of the memory hole MH. The insulating core is, for example, silicon oxide formed by CVD to fill the inside of the semiconductor layer in the memory hole MH.

Further, a slit ST that divides portions of the interlayer insulating films 13, 15 and the sacrificial films 33 is formed. The slit ST has a depth extending from the uppermost interlayer insulating film 15 to the source layer SL, and extends, for example, in the X direction. The slit ST is formed, for example, by selectively removing the interlayer insulating films 13, 15 and the sacrificial films 33 using anisotropic RIE.

Figure 7B:
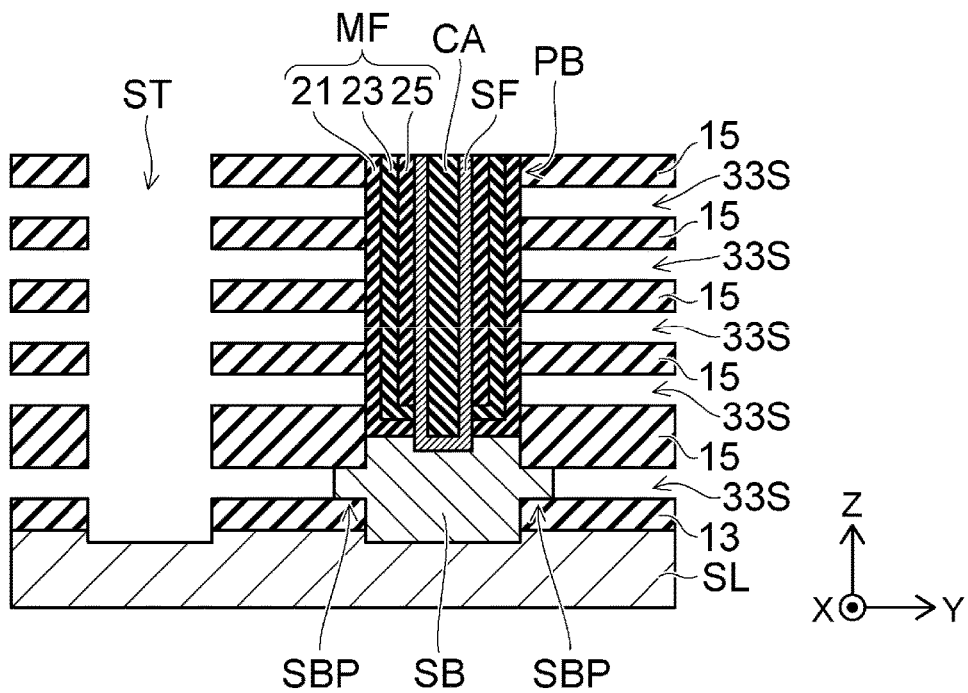

As shown in FIG. 7B, spaces 33S are formed between the interlayer insulating film 13 and the adjacent interlayer insulating film 15, and between the adjacent interlayer insulating films 15 by selectively removing the sacrificial films 33 and a portion of the insulating film 35 embedded in the recessed portions RC. The sacrificial films 33 and the portions of the insulating films 35 are selectively removed by, for example, supplying an etchant such as phosphoric acid through the slit ST.

Figure 8A:
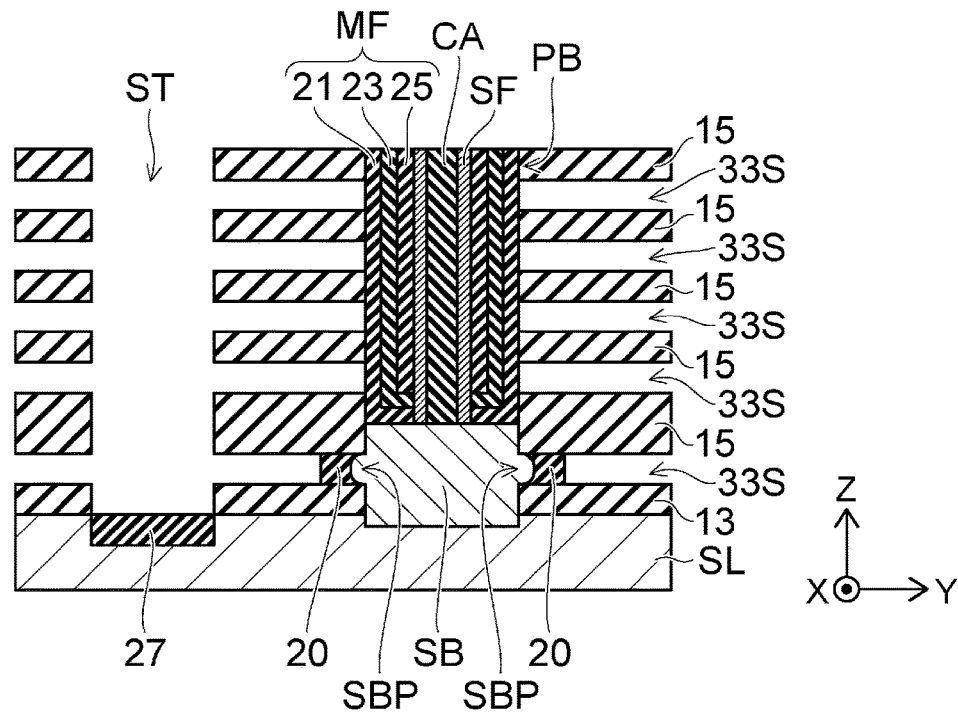
FIGS. 8A and 8B show schematic cross-sectional views showing the manufacturing process continued from FIGS. 7A and 7B.

As shown in FIG. 8A, the insulating film 20 is formed by thermally oxidizing the convex portion SBP of the semiconductor base SB. The insulating film 20 is formed by supplying oxygen or oxygen radicals to the space 33S closest to the source layer SL through the slit ST. Consequently, a portion of the source layer SL exposed to the bottom surface of the slit ST is also oxidized to form an insulating film 27.

Figure 8B:
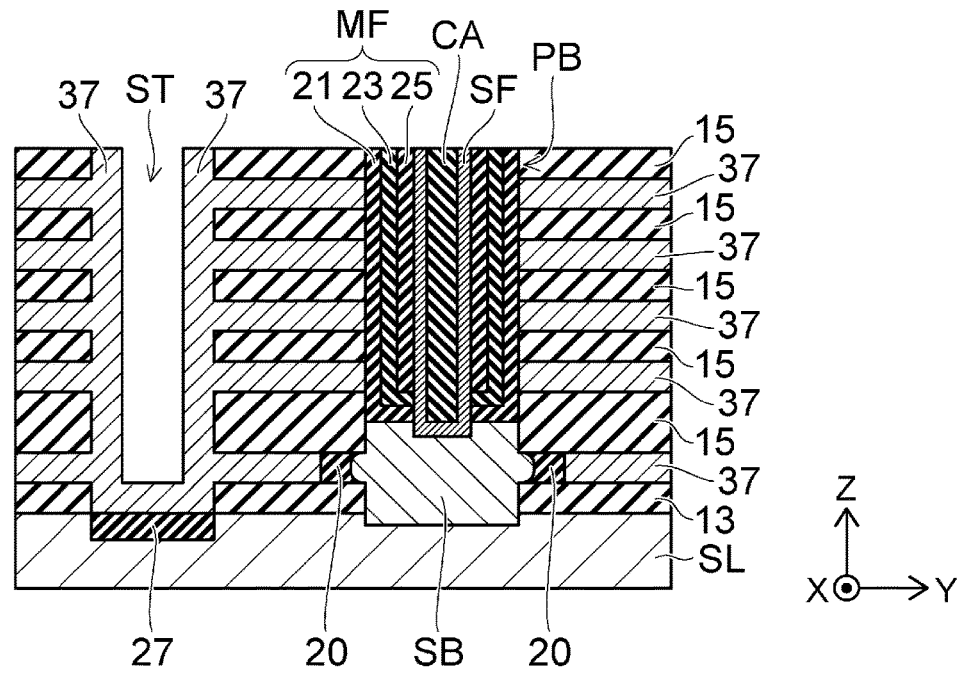

As shown in FIG. 8B, a metallic layer 37 is formed inside the spaces 33S. The metallic layer 37 is, for example, a tungsten layer formed by CVD. The metallic layer 37 is formed by supplying a source gas through the slit ST. As a result, the metallic layer 37 also covers the inner surface of the slit ST.

Figure 9A:
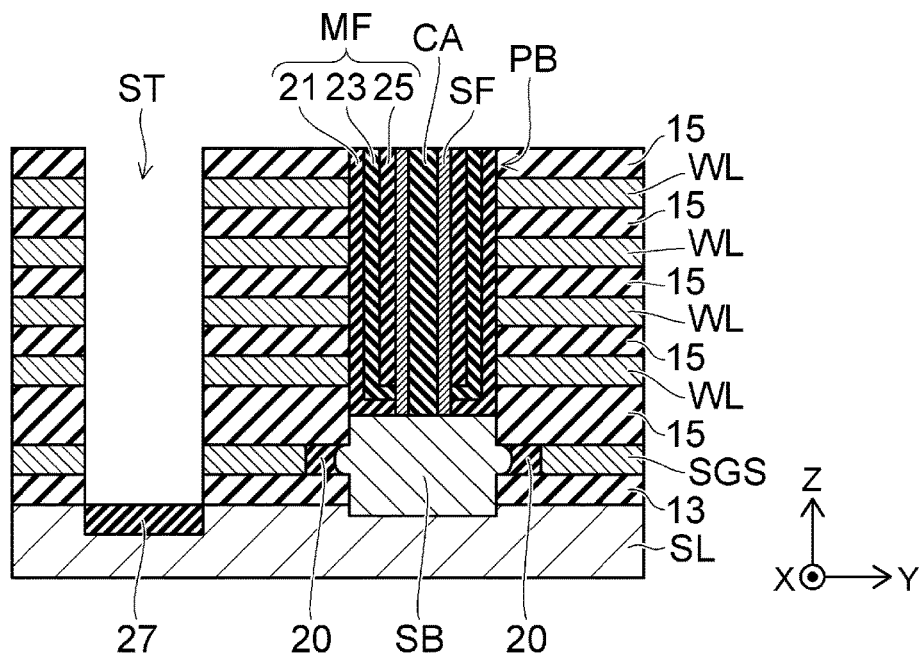
FIGS. 9A and 9B show schematic cross-sectional views showing the manufacturing process continued from FIGS. 8A and 8B.

As shown in FIG. 9A, a select gate SGS and word lines WL are formed. For example, isotropic dry etching is used to remove the portion of the metallic layer 37 covering the inner surface of the slit ST. In this way, the portions of the metallic layers 37 filling the spaces 33S can be separated from each other to form the select gate SGS and the word lines WL. Further, the select gate SGD is also formed in a portion not shown.

Figure 9B:
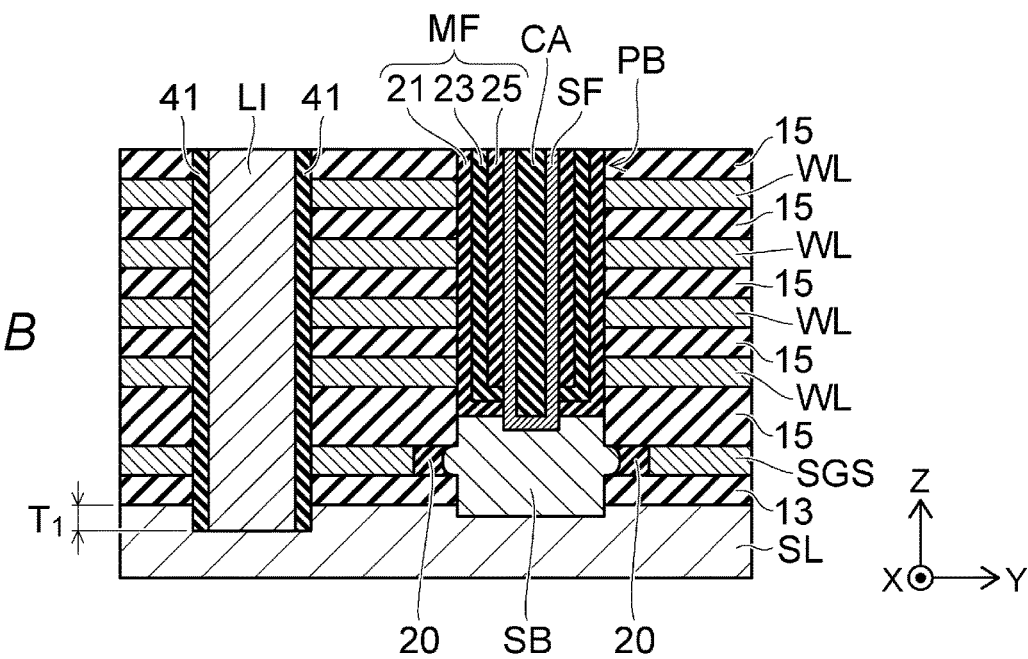

As shown in FIG. 9B, a lead layer LI is formed inside the slit ST. The lead layer LI electrically connects the source layer SL to wiring (not shown) at an upper layer. The lead layer LI is formed, for example, by forming an insulating film 41 inside the slit ST, selectively removing the insulating films 27, 41 at the bottom surface of the slit ST, and then filling a conductor such as tungsten (W) inside the slit ST.

Figure 13A:
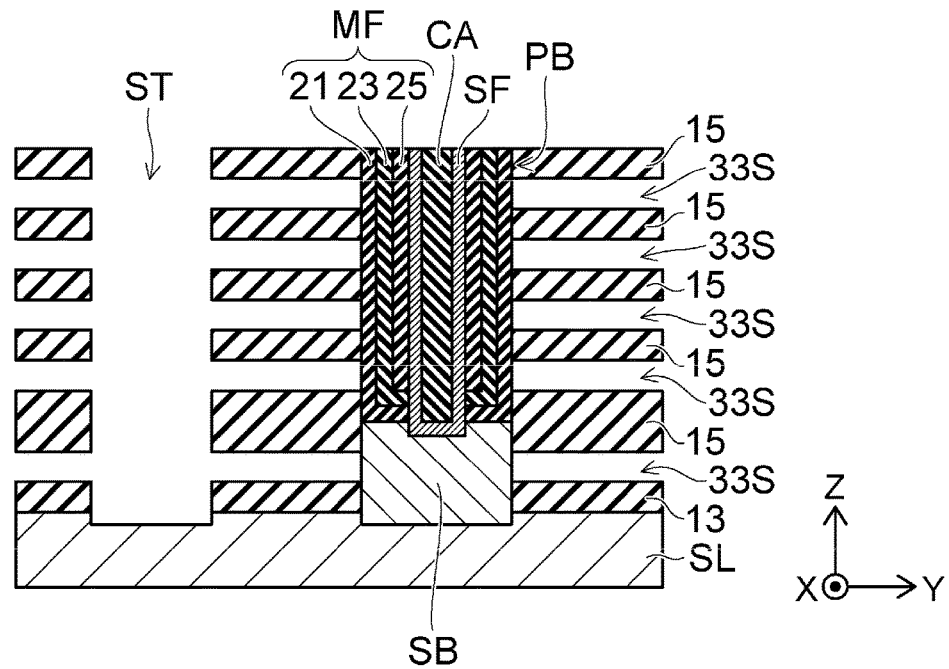
FIGS. 13A and 13B show schematic cross-sectional views showing a manufacturing process of the memory device according to a comparative example.
Figure 13B:
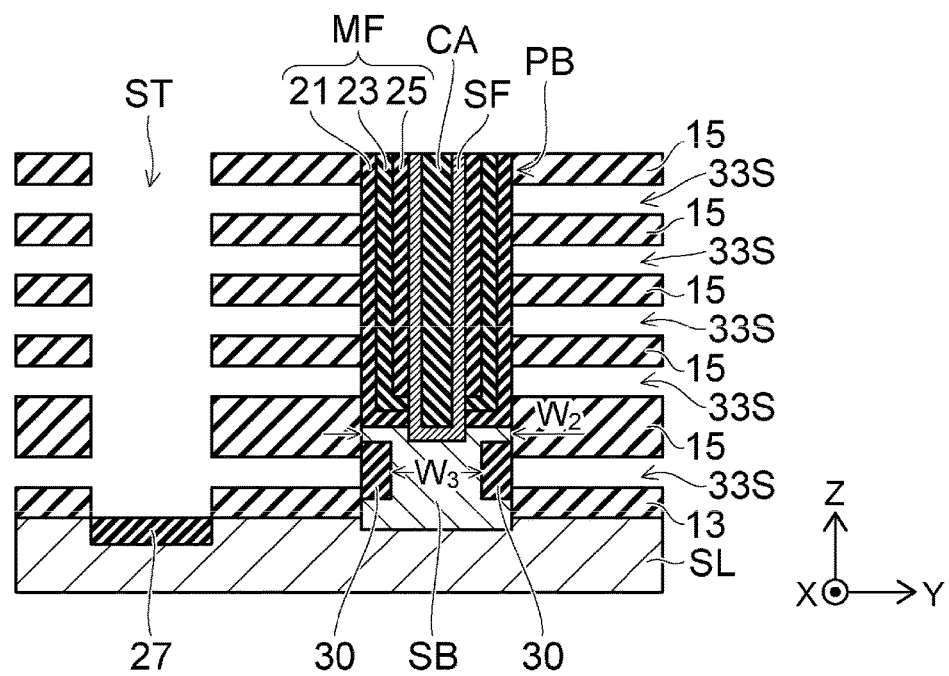

FIGS. 13A and 13B are schematic cross-sectional views showing a manufacturing process of a memory device according to a comparative example. FIG. 13A shows a space 33S formed by selectively removing the sacrificial film 33. FIG. 13B shows an insulating film 30 formed by thermally oxidizing the semiconductor base SB.

As shown in FIG. 13A, the semiconductor base SB does not have the convex portion SBP (see FIG. 7B). That is, the semiconductor base SB has a flat side surface without irregularities.

Subsequently, as shown in FIG. 13B, a portion of the semiconductor base SB is thermally oxidized to form the insulating film 30. Therefore, the portion of the semiconductor base SB surrounded by the insulating film 30 is thinner than the other portions. For example, the width W3 in the Y direction of the portion of the semiconductor base SB surrounded by the insulating film 30 is narrower than the width W2 in the Y direction of the upper end connected to the semiconductor layer SF.

On the other hand, in the present embodiment, by forming the convex portion SBP on the side surface of the semiconductor base SB, the width W1 in the Y direction of the portion surrounded by the insulating film 20 of the semiconductor base SB can be made equal to or wider than the width W2 in the Y direction of the upper end connected to the semiconductor layer SF, as shown in FIGS. 2A and 2B. As a result, the mechanical strength of the semiconductor base SB is improved, and damage during the manufacturing process can be prevented.

In the present embodiment, the recessed portions RC formed in the memory hole MH are filled with the insulating film 35 to make the inside wall of the memory hole MH flat. As a result, the semiconductor layer SF is formed in a cylindrical shape extending linearly in the Z direction. As a result, the channel length of the memory cell MC is shortened as compared with the case of being provided in the memory hole MH having the recessed portion RC, and the channel resistance can be reduced.

Second Embodiment

Referring to FIGS. 10A to 12B, a method of manufacturing the memory device 1 according to the second embodiment will be described. FIGS. 10A to 12B are schematic cross-sectional views showing a manufacturing process of the memory device 1.

Figure 10A:
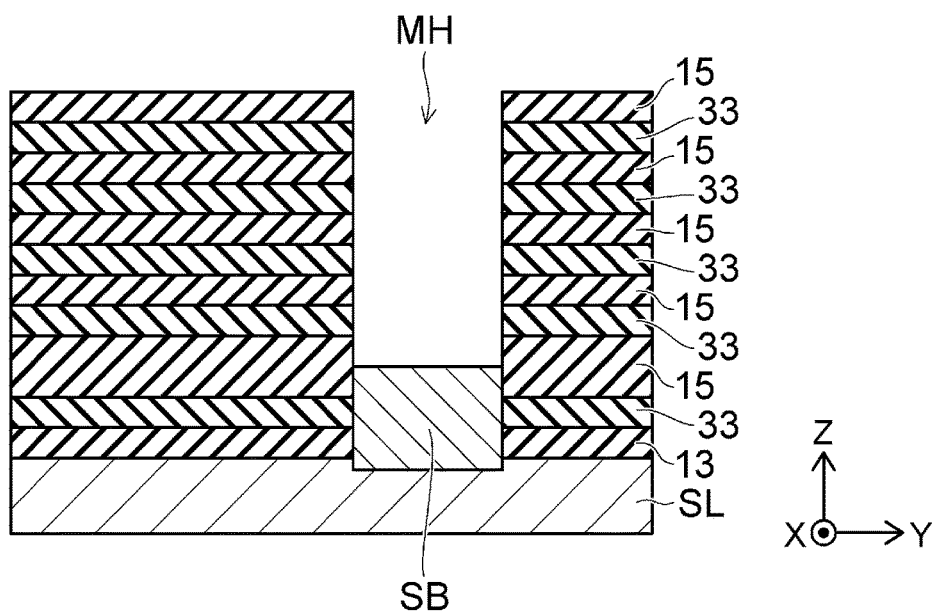
FIGS. 10A and 10B show schematic cross-sectional views showing a manufacturing process of the memory device according to a second embodiment.

As shown in FIG. 10A, a semiconductor base SB is at the bottom of the memory hole MH. The semiconductor base SB is, for example, single crystal silicon epitaxially grown on the source layer SL. In this example, the recessed portions RC (see FIG. 4A) are not formed inside the memory hole MH, and the semiconductor base SB has a side surface without unevenness along the inner wall of the memory hole MH.

Figure 10B:
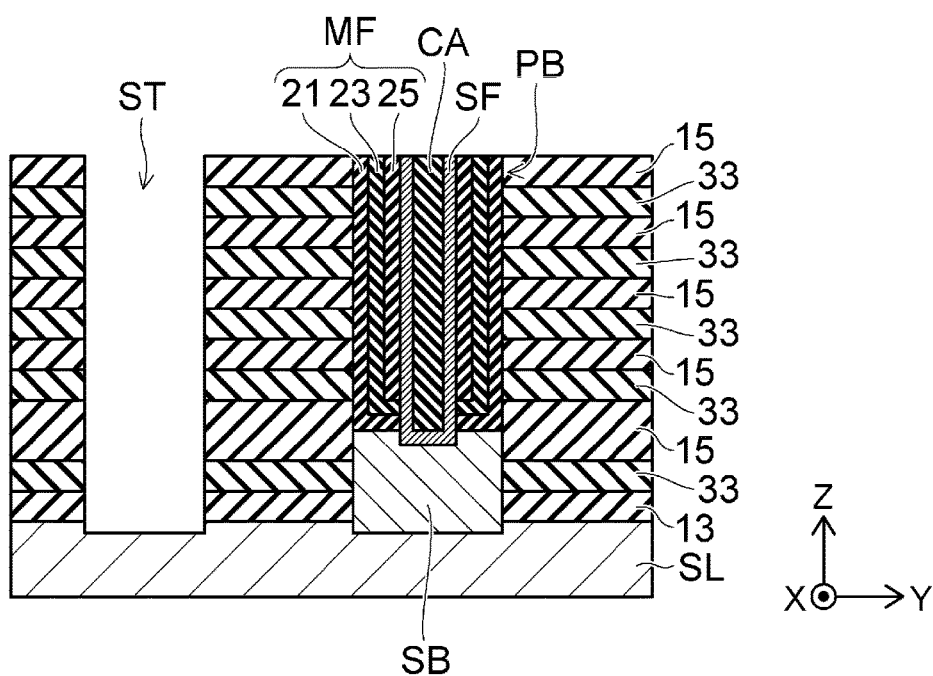

As shown in FIG. 10B, the columnar body PB is formed on top of the semiconductor base inside the memory hole MH. The columnar body PB has a memory film MF, a semiconductor layer SF, and an insulating core CA. The columnar body PB is formed using the method described in the first embodiment. Further, a slit ST that divides the interlayer insulating films 13, 15 and the sacrificial films 33 is formed.

Figure 11A:
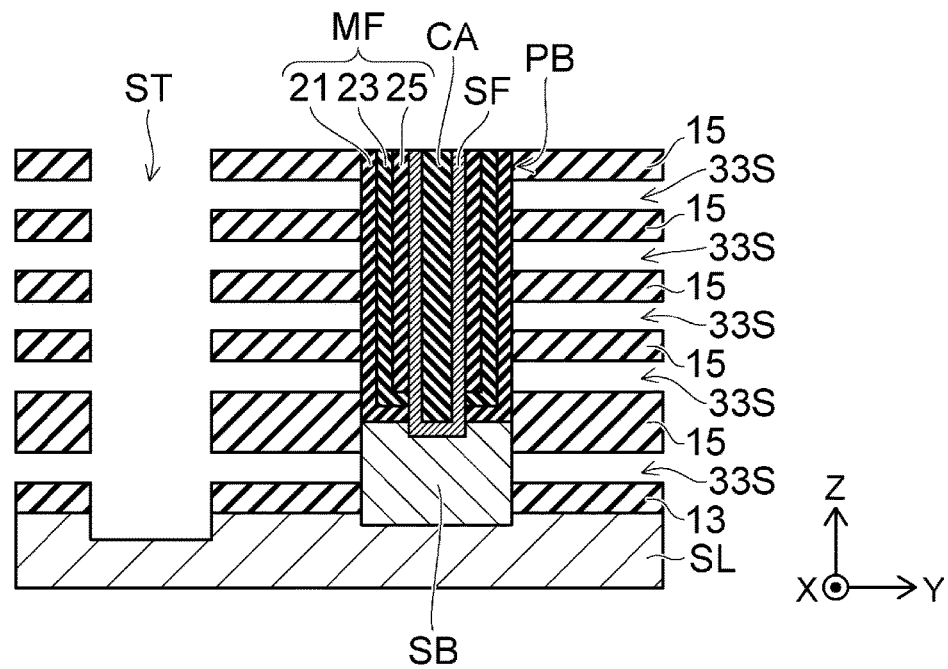
FIGS. 11A and 11B show schematic cross-sectional views showing the manufacturing process continued from FIGS. 10A and 10B.

As shown in FIG. 11A, by selectively removing the sacrificial film 33 through the slit ST, a space 33S is formed between the interlayer insulating film 13 and the interlayer insulating film 15 and between the adjacent interlayer insulating films 15.

Figure 11B:
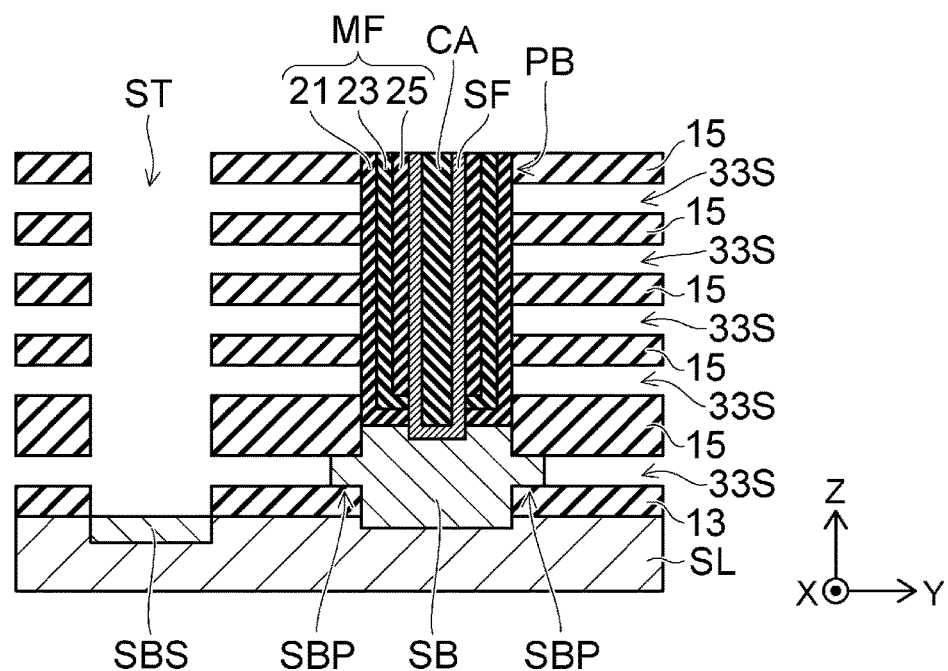

As shown in FIG. 11B, in the space 33S closest to the source layer SL, the convex portion SBP is formed on the side surface of the semiconductor base SB. The convex portion SBP is, for example, an epitaxially grown single crystal silicon layer. For example, monosilane ($SiH_4$), which is a raw material for epitaxial growth, is supplied to the space 33S through the slit ST. Therefore, the semiconductor layer SBS is also formed on the source layer SL exposed at the bottom surface of the slit ST. The semiconductor layer SBS is, for example, an epitaxially grown single crystal silicon layer.

As shown in FIG. 12A, the insulating film 20 is formed by thermally oxidizing the convex portion SBP. The convex portion SBP is formed by supplying oxygen or oxygen radicals to the space 33S closest to the source layer SL through the slit ST. Therefore, a part of the semiconductor layer SBS formed on the bottom surface of the slit ST is also oxidized to form the insulating film 27.

As shown in FIG. 12B, the lead layer LI is formed inside the slit ST. The lead layer LI is formed, for example, by forming an insulating film 41 inside the slit ST, selectively removing the insulating films 27, 41 at the bottom surface of the slit ST, and then filling a conductor such as tungsten (W) inside the slit ST.

Also in the present embodiment, by providing the convex portion SBP on the side surface of the semiconductor base SB, the width W1 in the Y direction of the portion of the semiconductor base SB surrounded by the insulating film 20 can be made equal to or wider than the width W2 in the Y direction of the upper end connected to the semiconductor layer SF. As a result, the mechanical strength of the semiconductor base SB is improved, and damage during the manufacturing process can be prevented.

In the present embodiment, by forming the lead layer LI on top of the semiconductor layer SBS, the adhesion strength of the lead layer LI to the source layer SL can be improved. Further, by interposing the semiconductor layer SBS, the contact resistance between the lead layer LI and the source layer SL can be reduced.

Further, by forming the semiconductor layer SBS on the bottom surface of the slit ST, the length T2 of the portion of the insulating film 41 extending into the source layer SL can be made shorter than the length T1 (see FIG. 9B) of the same portion in the first embodiment. In this way, the current path between the lead layer LI and the semiconductor base SB can be shortened. As a result, the electric resistance between the lead layer LI and the semiconductor base SB can be reduced.

While a few embodiments of the disclosure have been described, these embodiments have been presented by way of example and are not intended to limit the scope of the disclosure. These novel embodiments may be implemented in various other forms, and various omissions, substitutions, and alterations may be made without departing from the spirit and scope of the disclosure. These embodiments and modifications thereof are included in the scope and gist of the disclosure, and are included in the scope and equivalents of the disclosure described in the claims.

What is claimed is:

1. A method of manufacturing a memory device, comprising:
    forming a stack of a plurality of alternating first insulating films and sacrificial films on a conductive layer;
    forming a first hole penetrating the plurality of first insulating films and the plurality of sacrificial films and extending to the conductive layer;
    forming a semiconductor base on top of the conductive layer inside the first hole, the semiconductor base having an upper end positioned between a first sacrificial film, among the plurality of sacrificial films, nearest to the conductive layer and a second sacrificial film, among the plurality of sacrificial films, second nearest to the conductive layer;
    forming a columnar semiconductor layer within the first hole and over the semiconductor base;
    forming a plurality of spaces between the plurality of first insulating films by selectively removing the plurality of sacrificial films;
    after forming the columnar semiconductor layer and after forming the plurality of spaces, forming an extension of the semiconductor base on a sidewall of the semiconductor base and into one of the plurality of spaces nearest to the conductive layer;
    forming a second insulating film by oxidizing at least a portion of the extension on the sidewall of the semiconductor base; and
    forming an electrode layer in each of the plurality of spaces.

2. The method according to claim 1, wherein, after the second insulating film is formed, a portion of the extension on the sidewall of the semiconductor base remains extending inwardly of the space nearest to the conductive layer.

3. The method according to claim 2, wherein the semiconductor base and the portion of the extension comprise silicon.

4. The method according to claim 2, wherein the semiconductor base is epitaxially grown on a portion of the conductive layer exposed to the first hole, and the portion of the extension is epitaxially grown on the semiconductor base.

5. The method according to claim 1, further comprising:
    forming a slit through the plurality of alternating first insulating films and sacrificial films on the conductive layer extending to the conductive layer.

6. The method according to claim 5, further comprising:
    forming a semiconductor layer on the conductive layer exposed to the slit while forming the extension on the sidewall of the semiconductor base.

* * * * *